INTERMETALLIC COMPOUND SEMICONDUCTOR DEVICES

Filed Jan. 28, 1964

INVENTORS
HISASHI WATANABE
KUNIHARU NEMOTO
BY
Hopgood & Calimafde
ATTORNEYS

United States Patent Office 3,299,330
Patented Jan. 17, 1967

3,299,330
INTERMETALLIC COMPOUND SEMICONDUCTOR DEVICES

Hisashi Watanabe and Kuniharu Nemoto, Shiba Mita, Minatoku, Tokyo, Japan, assignors to Nippon Electric Company Limited, Tokyo, Japan, a corporation of Japan Filed Jan. 28, 1964, Ser. No. 340,734
Claims priority, application Japan, Feb. 7, 1963, 38/6,488
2 Claims. (Cl. 317—235)

This invention relates to improved semiconductor devices and more particularly to such devices which include a semiconductor substrate crystal having a high electrical conductivity, and on which is grown a semiconductor crystal layer of different substance from the substrate, this layer forming an element of the semiconductor device.

Epitaxial diodes and transistors are known wherein a germanium or silicon crystal is employed as a substrate and on the surface of which the same type semiconductor layer is grown from a vapor phase source while maintaining the orginial crystal structure. Then one or a plurality of p-n junctions is formed in this grown layer. The diodes and transistors so made have superior characteristics which render them suitable for use at high frequencies, because the base and collector resistances are low. However, an intermetallic compound semiconductor, such as for example, gallium arsenide, has been demonstrated as superior as a semiconductor material for use in diodes and transistors, in comparison with germanium and silicon, due to the fact that such material has a large forbidden band width and considerably greater electron mobility, and also has a small effective mass.

Accordingly it is one object of this invention to provide improved semiconductor devices which utilize intermetallic compound semiconductor materials.

Figure 1:
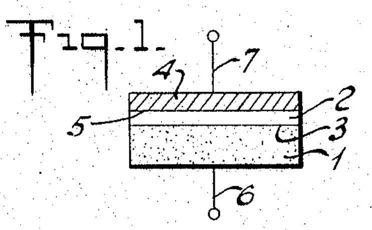
Figure 2:
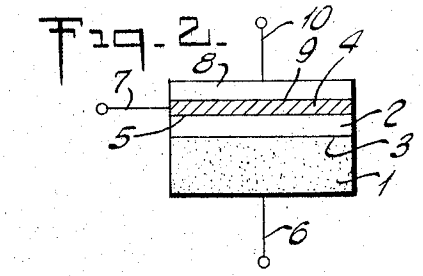

All of the objects, features and advantages of this invention and the manner of attaining them will become more apparent and the invention itself will be best understood by reference to the following description of an embodiment of the invention taken in conjunction with the accompanying drawing, in which:

FIGS. 1 and 2 show sections of the fundamental structure of semiconductor devices made according to this invention, and FIGS. 3*a*–3*f* and 4*a*–4*f*, illustrate in section practical semiconductor devices made according to the invention, at various steps during manufacture.

In accordance with the invention, a semiconductor device is made by forming on a semiconductor substrate crystal, preferably by expitaxial vapor growth technique, a comparatively thin layer of semiconductor intermetallic compound crystal which has a similar lattice constant to that of the substrate crystal, so that the resistance of the junction formed between the substrate and layer is relatively small. By using the potential barrier produced on the surface of this intermetallic compound semiconductor or the p-n junction formed by this layer, a semiconductor device having the fundamental superior characteristics attributable to the intermetallic compound is obtained.

FIG. 1 shows the fundamental structure of a diode made according to this invention. In FIG. 1, the numeral 1 denotes a substrate crystal, and the numeral 2 indicates an intermetallic compound crystal which has a similar lattice constant to that of the substrate crystal. A junction 3 is formed between the crystals 1 and 2. It is necessary to select the combination of conductivity types of the crystals 1 and 2 in order to make the resistance of the junction 3 a low value compared to the resistance values of the crystals. The numeral 4 denotes an intermetallic compound crystal having an opposite conductivity type to that of the crystal 2.

The method of manufacture of the structure described above comprises: first, growing the intermetallic compound crystal layer 2 on the substrate crystal 1, preferably by vapor technique, and second, utilizing alloy or impurity diffusion methods to form a junction in the vapor grown region, or utilizing a vapor growing technique to form a junction between the two vapor grown regions. In the case of the diode of FIG. 1 wherein the numeral 5 denotes a p-n junction, electrodes 6 and 7 are provided and are electrically connected to the regions 1 and 4 respectively.

FIG. 2 shows the fundamental structure of a transistor made in accordance with the invention. In this figure, the numeral 1 denotes a substrate crystal, 2 is an intermetallic compound crystal, and the resistance of the junction 3 between these crystals is a low value. Numerals 4 and 8 denote crystal regions having respectively opposite and the same type of conductivity as that of the region 2 and may be formed according to the method described above. Accordingly, the junction 5 between the regions 2 and 4 and the junction 9 between the regions 4 and 8 are both p-n junctions. Electrodes 6, 7 and 10 are connected to the regions 1, 4 and 8, these regions forming, respectively, the collector, base and emitter of FIG. 2 transistor.

In FIGS. 1 and 2, if a semiconductor crystal which has sufficiently low resistivity is used as the substrate crystal 1, and if the resistance produced in the junction 3 between the reginons 1 and 2 is made sufficiently low, and if the region 2 is made sufficiently thin, it is possible to sufficiently reduce the base resistance of the diode of FIG. 1 and the resistance of the collector region of FIG. 2, so as to produce semiconductor devices having intermetallic compound p-n junctions which have superior high frequency characteristics.

Semiconductor devices constructed in accordance with the teachings above have the advantage that the necessary amount of intermetallic compound for each element is substantially reduced, as is the processing material loss, from the amount required for prior art constructions. A good portion of this economy is attributable to the use of the comparatively thin layer of the intermetallic crystal compound by reason of growing it on the surface of the substrate crystal. It will therefore be appreciated that the material manufacturing cost is reduced by means of the invention.

Figure 3:
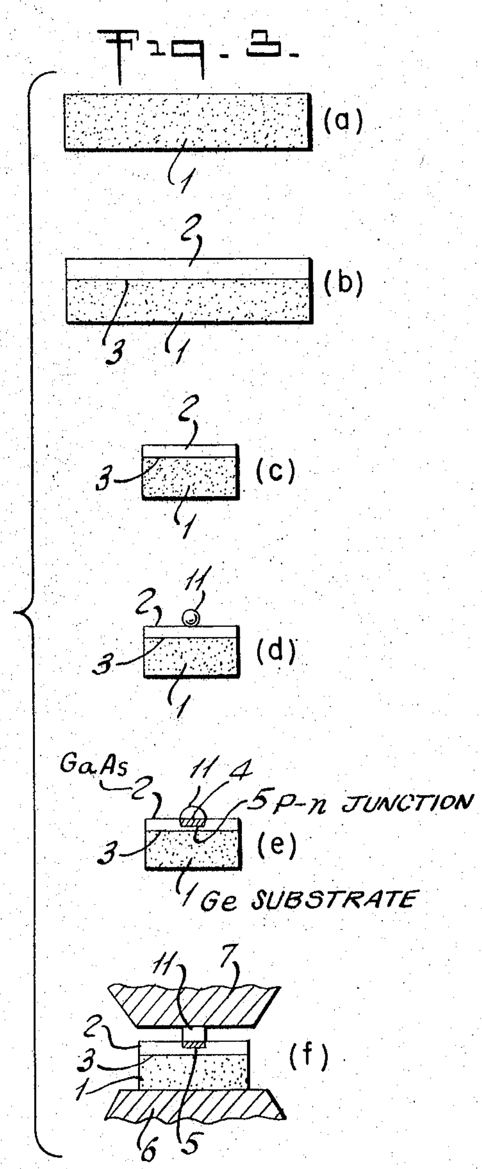

FIGS. 3*a* to 3*f* illustrate the formation of an Esaki diode at various steps during its manufacture, in accordance with the invention. In FIG. 3, the numeral 1 denotes a substrate crystal, which is preferably a thin wafer cut from a p-type germanium single crystal having a low resistance of the order of approximately 0.001 ohm-cm., and mirror polished. The growth of an intermetallic compound 2 of gallium arsenide (hereinafter referred to simply as gallium arsenide) is accomplished by sealing three 3 gr. germanium wafer substrates together, utilizing 0.1 gr. of gallium arsenide as a source material, 50 mgr. of zinc chloride ($ZnCl_2$) as a transport medium, and 100 mgr. of arsenide for vapor pressure adjustment of the arsenic. The process is carried out in an evacuated quartz tube. The germanium crystal and arsenic are heated to approximately 600° C. and the gallium arsenic to approximately 950° C. In approximately two hours of reaction time, a degenerated p-type gallium arsenide layer 2 having a thickness of approximately $2 \times 10^{-3}$ cm. and an impurity concentration of $2 \times 10^{19}$ cm.$^{-3}$ is grown on the surface of the germanium substrate 1 as seen in FIG. 3b et seq.

In the resulting structure shown in FIG. 3b, almost no potential barrier exists at the junction 3 between the regions 1 and 2 and the junction resistance is extremely low. The above mentioned growing method is merely one practical example, and it is possible to further reduce the material cost by epitaxially growing the region 2 from halides of gallium arsenic instead of expensive gallium arsenide as the source material. When growing gallium arsenide of high impurity concentration on germanium of high impurity concentration, even if n-type gallium arsenide is grown on n-type germanium, the resistance of the junction between the two may still be made very low. Generally, however, in order to make the resistance of the junction between the different regions sufficiently low, it is necessary to select an appropriate material, conductivity type and impurity concentration for a semiconductor substrate and a suitable intermetallic compound semiconductor. Between germanium and gallium arsenide, it is possible to obtain desired element characteristics by first growing a gallium arsenide crystal layer of high impurity concentration on germanium of high impurity concentration, and then a gallium arsenide layer of predetermined impurity concentration is grown on the first crystal surface. The epitaxially grown wafer thus grown would appear as in FIG. 3b and is then cut out into small crystal pieces, one of which is shown in FIG. 3c.

Referring next to FIG. 3d, a tin ball 11 which may have a diameter of $10^{-2}$ cm. is placed on the surface of the gallium arsenide layer 2 and is alloyed into this layer by heating it in a nitrogen atmosphere at approximately 510° C. for 15 seconds.

Through this alloying process, a recrystallized region 4 of n-type gallium arsenide having a high impurity concentration is grown in the alloyed portion of the gallium arsenide layer, as shown in FIG. 3e, thus forming a p-n junction 5 which can produce a tunnel effect.

Next, as shown in FIG. 3f, a finished Esaki diode is obtained when the germanium crystal 1 is connected to a metal electrode 6 by using a foil of gold-gallium alloy, and another electrode 7 is suitably connected to the upper surface of the tin region 11. According to this method, an Esaki diode of gallium arsenile, having approximately $10^5$ A. cm.$^{-2}$ of maximum peak tunneling current density, and a ratio of peak current to valley current of approximately 20 to 1, can be obtained.

The gallium arsenide Esaki diode according to this invention has a large tunnel effect, as the effective mass of electrons is small, and its operating voltage can be made large because of the existence of a wide forbidden band. A further advantage is that the diode valley current is very small, and it is therefore very useful as a computer logic element and also as a memory circuit element.

Although the above practical example shows one embodiment of the invention applied to an Esaki diode, it will be clear that a diode of the point contact type can also be made according to the invention, such as by growing n-type gallium arsenide on an n-type germanium crystal, and point contacting a thin wire on the surface. A variable capacitance diode having a high Q can also be made according to the invention, such as by growing n-type gallium arsenide on an n-type germanium crystal, and forming a p-n junction in the gallium arsenide region by diffusing zinc which acts as a p-type impurity for gallium arsenide.

Figure 4:
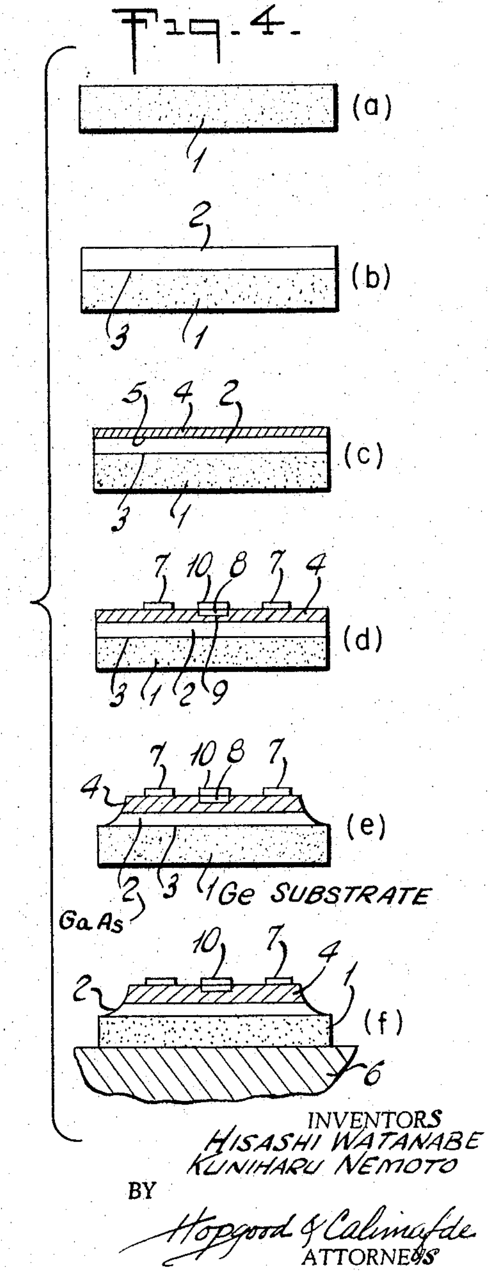

FIGS. 4a to 4f illustrate the formation of a multilayer p-n junction device such as a transistor, according to the invention. As seen in FIG. 4b, a gallium arsenide crystal layer 2 of $3 \times 10^{-3}$ cm. to $4 \times 10^{-3}$ cm. thickness is grown on an n-type germanium crystal 1 having approximately 0.001 ohm-cm. resistivity according to a method similar to that described in the fabrication of diodes, using n-type gallium arsenide with 0.1 ohm-cm. resistivity as a source of material, and also using iodine as a transport medium. The impurity concentration of the crystal layer 2 is approximately $10^{17}$ cm.$^{-3}$, but this concentration may be high in the portion of the layer immediately adjacent the junction 3, the junction 3 having a relatively low resistance value.

Next, with the above described sample, small pieces if gallium arsenide and zinc are sealed in an evacuated quartz tube and heated simultaneously at 850° C., 880° C. and 320° C., respectively, for two hours. This heat treatment causes the zinc to diffuse internally from the surface of the layer 2 and forms the p-type layer 4 having a thickness of $5 \times 10^{-4}$ cm., also producing the p-n junction between the layers 2 and 4. Then by means of a vacuum evaporation and alloying, gold and tin are evaporated on the surface of the layer and alloyed at 550° C., to thereby form connecting electrodes 7 of gold, which have low resistance contact with the layer 4, while forming an n-type emitter region 8 of tin, which is in contact with the emitter electrode 10, as shown in FIGS. 4d, 4e, and 4f. The numeral 9 in FIG. 4d indicates a p-n junction.

FIG. 4e shows the transistor after etching by a solution which may comprise 1 part hydrochloric acid and 5 parts nitric acid. The electrodes are protected with wax during the etching step, as is well known. FIG. 4f shows the transistor further assembled, having in contact with the crystal 1 an electrode 6 connected through suitable gold plating in order to provide low resistance contact. Suitable leads may be attached to the layers 7 and 10 to be connected to outer electrodes, not shown. The leads connected to the regions, 10, 7 and 6 will then form, respectively, the emitter, base and collector conductors.

While the specific example above relates to transistors, it is possible by similar methods, to obtain not only multilayer devices having p-n junctions but also structures having more than one diode and transistor in the gallium arsenide crystal region.

While the foregoing description sets forth the principles of the invention in connection with specific apparatus, it is to be understood that the description is made only by way of example and not as a limitation of the scope of the invention as set forth in the objects thereof and in the accompanying claims.

What is claimed is:

1. A semiconductor diode comprising
   - a semiconductor substrate crystal of germanium having a given type conductivity and a high impurity concentration,
   - a semiconductor intermetallic compound crystal layer of gallium arsenide formed on a surface of said substrate crystal, said layer being of said given type conductivity and also having a high impurity concentration, said latter impurity concentration being of the order of $2 \times 10^{19}$ cm$^{-3}$.
   - a junction between said substrate and said layer, said junction having a low ohmic resistance value, compared with the resistance values of said crystals.
   - a recrystallization region of gallium arsenide having a conductivity opposite to that of said given type formed on a side of said layer opposite to said substrate, said region also having a high impurity concentration, said impurity comprising tin,
   - a layer of tin on said recrystallization region, and a p-n junction formed between said crystal layer and said region, whereby said diode is caused to have improved high frequency characteristics.

2. A transistor comprising
   - a semiconductor substrate crystal of germanium having a given type conductivity, said substrate forming a collector electrode, a semiconductor intermetallic compound crystal layer of gallium arsenide formed on a surface of said substrate and also being of said given type conductivity, a junction between said substrate and said layer having a low value of ohmic resistance, compared with the resistance values of said crystals, a region of opposite type conductivity formed of gallium arsenide and zinc on said layer, said region comprising a base electrode, a p-n junction between said region and said layer, a region of given type conductivity and including tin formed on said region of opposite type conductivity and comprising an emitter electrode, and means for making electrical contact with each of said emitter, base and collector electrodes whereby said transistor has improved high frequency characteristics.

References Cited by the Examiner

UNITED STATES PATENTS

| | | | |
|---|---|---|---|
| 3,041,508 | 6/1962 | Henkel et al. | 317—237 |
| 3,072,507 | 1/1963 | Anderson et al. | 317—235 |
| 3,082,283 | 3/1963 | Anderson | 317—235 |
| 3,121,808 | 2/1964 | Kahng et al. | 148—175 |
| 3,165,811 | 1/1965 | Kleimack et al. | 148—175 |
| 3,234,057 | 2/1966 | Anderson | 317—235 |

OTHER REFERENCES

Silvey, G. A.: IBM Technical Disclosure Bulletin, Dec. 1961, vol. 4, No. 7, page 62, "Semiconductor Compounds."

JOHN W. HUCKERT, *Primary Examiner.*

JAMES D. KALLAM, *Examiner.*

J. R. SHEWMAKER, *Assistant Examiner.*